US012738933B2

(12) United States Patent
Koeppl et al.

(10) Patent No.: US 12,738,933 B2
(45) Date of Patent: Sep. 15, 2026

(54) SELF-LEARNING GATE DRIVER

(71) Applicant: Infineon Technologies AG, Neubiberg (DE)

(72) Inventors: Benno Koeppl, Markt Indersdorf (DE); Peter Stemplinger, Madrid (ES)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/799,765

(22) Filed: Aug. 9, 2024

(65) Prior Publication Data

US 2026/0045943 A1 Feb. 12, 2026

(51) Int. Cl.
*H03K 17/16* (2006.01)

(52) U.S. Cl.
CPC .................................. *H03K 17/162* (2013.01)

(58) Field of Classification Search
CPC .................................................... H03K 17/162
See application file for complete search history.

(56) References Cited

U.S. PATENT DOCUMENTS 7,180,337 B2 2/2007 Feldtkeller
12,418,277 B2 * 9/2025 Heckroth ............ H02M 1/0029

* cited by examiner

*Primary Examiner* — Ryan Johnson
*Assistant Examiner* — Colleen J O Toole
(74) *Attorney, Agent, or Firm* — Shumaker & Sieffert, P.A.

(57) ABSTRACT

An example gate driver circuit includes a sequencer comprising a plurality of parameters defining a gate signal, where the gate driver circuit is configured to output the gate signal to a gate of a switch. The gate driver circuit also includes a comparator configured to output a timing signal to a parameter generation unit, the timing signal being based on a response of the switch receiving the gate signal from the gate driver circuit. The timing signal is indicative of a characteristic of the switch, and the parameter generation unit is configured to determine a parameter of the plurality of parameters based on the characteristic of the switch. The gate driver circuit is also configured to receive input from the parameter generation unit and store the input in the sequencer, the input defining the parameter of the plurality of parameters determined by the processor.

24 Claims, 9 Drawing Sheets

200

SELF-LEARNING GATE DRIVER

TECHNICAL FIELD

This disclosure relates to circuits and techniques for controlling a power switching element.

BACKGROUND

A gate driver circuit activates a switching element (e.g., a power transistor) based on a switching signal. For example, a gate driver circuit may drive a switching element to couple a phase of a motor to a high voltage (e.g., a battery voltage) during a first portion of a switching signal and to couple the phase of the motor to a low voltage (e.g., a reference or ground voltage) during a second portion of the switching signal.

SUMMARY

In general, the disclosure describes characterization techniques to determine switch characteristics and timing and control conditions for accurate switch control. For example, a gate driver may include a sequencer including a plurality of switch control parameters defining control of the switch. Different switches have different characteristics, e.g., gate charge and discharge amounts (e.g., Q's) and times, slew rates, maximum load currents, or the like, and it can be difficult to accurately determine sequencer parameters without characterization of both the switch and a circuit including the switch. Techniques and devices described herein include outputting a gate signal to a gate of a switch and receiving timing signal from comparators of the gate driver based on the response of the switch.

The characterization techniques may be used to automatically determine and/or adjust sequencer parameters. The techniques and devices may provide good switching performance, e.g., meeting target slew rates with fast charge and discharge behavior covering the tolerance of the gate driver and switch.

In one example, this disclosure describes a gate driver circuit including: a sequencer comprising a plurality of parameters defining a gate signal, wherein the gate driver circuit is configured to output the gate signal to a gate of a switch; and a comparator configured to output a timing signal to a parameter generation unit, wherein the timing signal is based on a response of the switch receiving the gate signal from the gate driver circuit, wherein the timing signal is indicative of a characteristic of the switch, wherein the parameter generation unit is configured to determine a parameter of the plurality of parameters based on the characteristic of the switch, and wherein the gate driver circuit is configured to receive input from the parameter generation unit and store the input in the sequencer, wherein the input defines the parameter of the plurality of parameters determined by the parameter generation unit.

In another example, this disclosure describes a system including: a gate driver configured to output a gate signal to a gate of a switch; a sequencer comprising a plurality of parameters defining the gate signal; and a parameter generation unit configured to determine a parameter of the plurality of parameters and to cause the gate driver to output the gate signal to the switch according to the at least one parameter.

In another example, this disclosure describes a method including: causing, by a parameter generation unit, a gate driver to output a gate signal to a gate of a switch, wherein the gate driver includes a sequencer comprising a plurality of parameters defining the gate signal; receiving, in response to the gate signal and by the parameter generation unit from a comparator of the gate driver, a timing signal; determining, by the parameter generation unit, a characteristic of the switch based on the timing signal.

Details of these and other examples are set forth in the accompanying drawings and the description below. Other features, objects, and advantages will be apparent from the description and drawings, and from the claims.

DETAILED DESCRIPTION

Figure 1A:
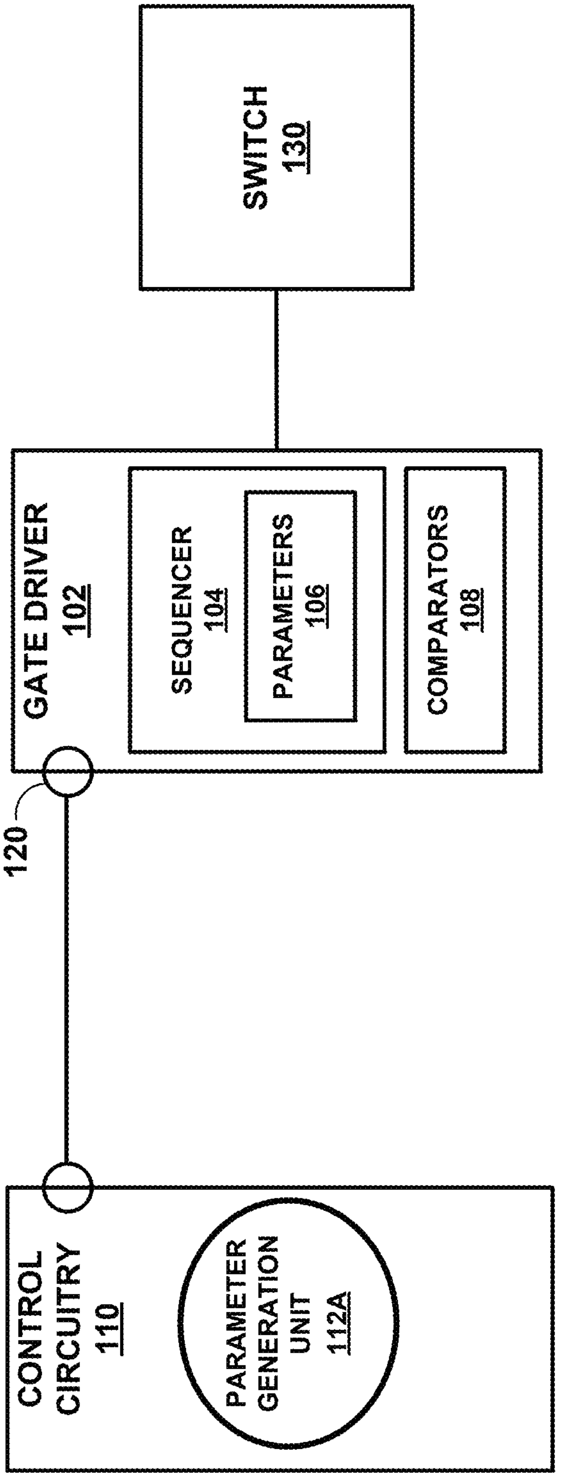
FIG. 1A is a block diagram illustrating an example system that includes a self-learning gate driver that may implement techniques of this disclosure.

This disclosure describes characterization techniques to determine switch characteristics and timing and control conditions for accurate switch control. For example, a switch may be characterized by its response to a gate signal applied to the gate of the switch. In some examples, switch response characteristics may include a pre-charge Q1, a Miller plateau charge Q2, a charge Q3, a switch-on slew rate, a switch-off slew rate, a maximum load current, or any suitable switch characteristic. Different switches, even of the same type, may respond differently to the same gate signal, e.g., with different switch timing and/or different source-drain current and/or resistance, depending on the switch characteristics of the individual switches. In some examples, switches are configured to operate in a sequence, and the differing switch characteristics of switches may cause the sequence to vary from a desired sequence for a given input gate signal designed to control the sequence.

A gate driver or gate drive circuit may include a sequencer configured to control a gate signal for driving the gate of a switch. The sequencer may include a plurality of parameters for controlling the gate signal. The sequencer parameters may be adjusted to compensate for varying switch characteristics. For example, the sequencer parameters may be adjusted to adjust the gate signal driving different switches such that the responses of the individual switches may be controlled, and switches configured to operate in sequence may affect the desired sequence.

In accordance with the techniques and devices disclosed herein, the characteristics of a switch may be determined based on measurements of the responses of a switch to input gate signals, and the plurality of parameters for the switch may be determined based on the switch characteristics (via the measurements). For example, a gate driver or gate driver circuit, or the sequencer, may include a comparator configured to output a timing signal based on the response of switch to an input gate current. The comparator may measure, to a very accurate degree, the timing of when a voltage of the gate, the source, and/or the drain is less than or greater than one or more threshold voltages, and may output the measurements as a timing signal, and the timing signal may be indicative of the switch characteristics.

The devices and techniques described herein provide a number of advantages. For example, the devices and techniques disclosed herein may provide automatic determination and/or adjustment of sequencer parameters with good switching performance, e.g., meeting target slew rates with fast charge and discharge behavior covering the tolerance of the gate driver and switch. For example, the number of parameters of the sequencer for controlling the gate signal may be relatively large, e.g., greater than 20, and some of the parameters may not be independent from each other, such that perturbing individual parameters and measuring results may be time-consuming and lead to inaccurate guesses of the correct parameter values for the parameters. Additionally, tolerances for hardware, such as current sources, may be very large (e.g., up to about 40%) and the switch may have a tolerance as well, such that tolerance calculations indicate that a fixed set of parameters may not achieve sufficient switching accuracy. Users may also want to change switches relatively quickly, and the layout of circuits in which a switch is used may also affect the switching response of a switch. Determining switch parameters by perturbing one or more parameters and adjusting based on the resulting response may not be practically achievable.

Determining switch characteristics of a switch, and then determining parameter settings based on the switch characteristics, may be practically achievable. For example, switch characteristics may be determined based on real-world measurements of the switch and/or simulation of switch characteristics, and the switch characteristics may be used to directly determine the parameters, whether the parameters are independent from each other or not. For example, one or more predetermined gate signals may be applied to a switch, the timing signals may be measured, the switch characteristics determined, and the parameters determined based on the switch characteristics, rather than blind hunting for parameters combinations that work based on changing parameter values and looking at the switch response. Determining parameters based on switch characteristics may also account for variations based on the layer of the circuit in which the switch is used and enable relatively rapid changing of switches (e.g., to a different switch of the same type or a different type), e.g., via determining the characteristics of the switch based on relatively fewer input/output measurements of responses of the switch while the switch is part of the intended circuit.

FIG. 1A is a block diagram illustrating an example system 100 that includes a gate driver 102 that may implement techniques of this disclosure. System 100 includes control circuitry 110, gate driver 102, and switch 130.

In the example of FIG. 1A, control circuitry 110 is arranged on a first integrated circuit and gate driver 102 is arranged on a second integrated circuit that is different from the first integrated circuit. However, in some examples, control circuitry 110 and gate driver 102 may be arranged in a single integrated circuit.

Control circuitry 110 may be configured to output a command. For example, control circuitry 110 may generate the command to indicate when to switch, when to apply slow switching, when to apply fast switching, when to apply a switching sequence, or to indicate information, such as parameter values of parameters 106. Control circuitry 110 may receive information and/or data from gate driver 102, sequencer 104, and/or comparators 108. Control circuitry 110 may include one or more processors, such as one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

In the examples shown, gate driver 102 includes sequencer 104, comparators 108, and node 120. In some examples, node 120 may be configured to receive and send commands, information, and/or data. Gate driver 102 may be configured to drive switch 130 based on the commands, information, and/or data. For example, control circuitry 110 may be configured to cause gate driver 102 to drive switch 130, e.g., by outputting a gate signal to the gate of switch 130. In some examples, gate driver 102 may include processing circuitry configured to communicate with control circuitry 110 and to cause gate driver 102 to drive switch 130. For example, gate driver 102 may include one or more processors, such as one or more microprocessors, DSPs, ASICs, FPGAs, or any other equivalent integrated or discrete logic circuitry, as well as any combinations of such components.

Node 120 may correspond to one or more electrical pins of gate driver 102, which may be coupled to another circuit, such as control circuitry 110. In some examples, node 120 may comprise a dedicated pin for the functions described herein. In other examples, node 120 may comprise an existing pin used for other functions and also leveraged for the functions described herein. Node 120, for example, may comprise an overcurrent detection pin (ODP), or a so-called desaturation (DESAT) detection pin, one or more serial peripheral interface (SPI) pins, or any other suitable pins. In still other examples, node 120 may comprise a gate clamp pin, or any other pin capable of providing access to node 102.

In some examples, gate driver 102 may include additional components. For example, gate driver 102 may comprise a DC/DC power converter, a voltage regulator, or another voltage control circuit configured to define gate voltages sufficient to control the ON/OFF state of switch 130. Gate driver 102 may be connected to a supply, and control circuitry 110 may be galvanically isolated from switch 130, e.g., switch 130 may be included in a power circuit.

Sequencer 104 may be configured to define a gate signal to drive switch 130. In the example shown, sequencer 104 includes parameters 106. Parameters 106 may be a plurality of parameters that may be used to form the gate signal. For example, parameters 106 may determine the time duration and levels of current and/or voltage to be applied to the gate of switch 130 to control activation and/or deactivation of switch 130. In some examples, parameters 106 may determine a gate signal as a current or voltage waveform to be output to the gate of switch 130 by gate driver 102. Parameters 106 may include a gate signal current (Igate), a pre-charge time, a pre-charge current, and charge current, a pre-discharge time, a pre-discharge current, a discharge current, and the like. Table 1 below is a non-exclusive list of parameters that parameters 106 may include.

TABLE 1

| Parameter Name | Parameter Description |
|---|---|
| Type | Type of Switch |
| TDEL | Delay time between Input signal change until gate current starts to flow |
| Treduced | Reduced TPCHG and TPDCHG compared to setting |
| Tcomp | For better matching with the real measurements |
| TDON | Time delay switch On |
| TDOFF | Time delay switch Off |
| TPCHG | Pre-charge time seeting (active MOS; switch on) |
| TPDCHG | Pre-discharge time setting (active MOS; switch off) |
| ICHG | gate current for dI/dt phase (active MOS; switch on) |
| IDCHG | gate current for dI/dt phase (active MOS; switch off) |
| ICHGDV | gate current for dV/dt phase (active MOS; switch on) |
| IDCHGDV | gate current for dV/dt phase (active MOS; switch off) |
| IPCHG | gate current for pre-charge phase (active MOS; switch on) |
| IPDCHG | gate current for pre-charge phase (active MOS; switch off) |
| IPOSTCHG | gate current for post charge phase (active MOS; switch on) |
| TCCP | Cross current protection time (dead time for active MOSFET) |
| TCCPFW | Cross current protection time (dead time for passive MOSFET) |
| IDCHGFW | gate current for passive MOSFET (switch off) |
| ICHGFW | gate current for passive MOSFET (switch on) |
| APCM_EN | |
| IPDCHGMAX | fixed max current |
| IHOLD | Hold current to keep the MOSFET off (not relevant for sequencer) |
| FAST_CMP_TH | Setting for comparator thesholds and behavior |
| AFCMP_TH_EN | Setting for comparator thesholds and behavior |

Parameters 106 may include a plurality of parameters for a single switch 130, or for each of a plurality of switches 130. Sequencer 104 may be configured to control one or more switches 130 to operate in a sequence. For example, sequencer 104 may be configured to output gate signals based on parameters 106 to control one or more switches 130 to activate and deactivate according to a sequence.

Comparators 108 may be configured to output a timing signal to control circuitry 110. For example, comparators 108 may include a comparator configured to determine the time at which a voltage of switch 130 changes from less than a threshold voltage to greater than the threshold voltage, or from greater than the threshold voltage to less than the threshold voltage, e.g., comparing the voltage to the threshold voltage and outputting the time at which a voltage crosses a threshold voltage level. In some examples, comparators 108 may represent other means for determining the timing signal. For example, comparators 108 may be analog to digital converters (ADCs) rather than voltage comparators.

Comparators 108 may be configured to output the time as a timing signal based on a response of the switch receiving the gate signal from gate driver circuit 102. The timing signal may be indicative of a characteristic of the switch. In some examples, comparators 108 may include a plurality of comparators configured to output individual voltage crossing times, or to output an amount of time between voltage levels. For example, comparators 108 may include a first comparator and a second comparator, and comparators 108 may be configured to output the timing signal and a time difference between when the voltage crosses a first voltage threshold level and then subsequently crosses a second voltage threshold level. In some examples, comparators 108 may output the timing signal as absolute times, time differences, or both.

Switch 130 may be configured to activate (e.g., switch-on=switch to conductive mode) and deactivate (e.g., switch-off=switch to non-conducting mode). For example, gate driver 102 may drive switch 130 to switch-on or switch-off using a control node or a gate of switch 130. Switch 130 may represent a switching element. Examples of switching elements may include, but are not limited to, a silicon-controlled rectifier (SCR), a Field Effect Transistor (FET), and a bipolar junction transistor (BJT), or insulated gate bipolar transistors (IGBT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. MOSFETS may be formed in silicon, gallium nitride (GaN), silicon carbide (SiC) or other semiconductor materials.

Control circuitry 110 may include parameter generation unit 112A. Parameter generation unit 112A may be configured to determine the parameters of parameters 106. For example, parameter generation unit 112A may comprise a processor, e.g., of control circuitry 110. In some examples, parameter generation unit 112A may comprise software instructions executable by processing circuitry or a processor, e.g., control circuitry 110. In some examples, parameter generation unit 112A may be configured to determine parameters 106 based on a timing signal. For example, parameter generation unit 112A may receive a timing signal from gate driver 102 and/or comparators 108 via node 120, and the timing signal may be indicative of at least one characteristic of switch 130. For example, the timing signal may be indicative of switch characteristics such as a pre-charge Q1, a Miller plateau charge Q2, a charge Q3, a switch-on slew rate, a switch-off slew rate, a maximum load current, or any suitable switch characteristic. Parameter generation unit 112A may be configured to determine parameters 106 based on one or more of the switch characteristics. In some examples, parameter generation unit 112A may be configured to perform the operations ascribed to control circuitry 110 described herein.

Figure 1B:
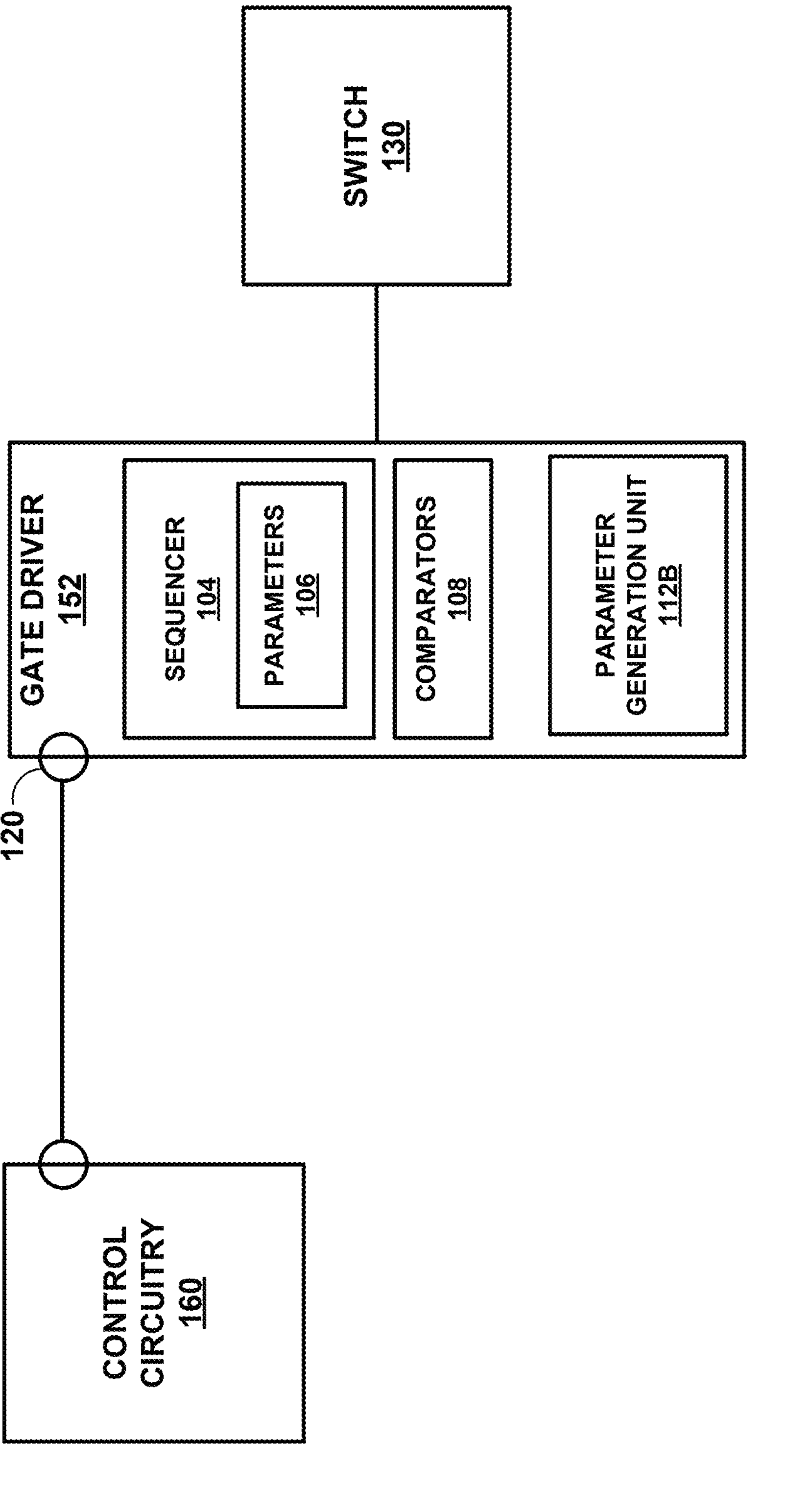
FIG. 1B is another block diagram illustrating an example system that includes a self-learning gate driver that may implement techniques of this disclosure.

FIG. 1B is a block diagram illustrating another example system 150 that includes a gate driver 152 that may implement techniques of this disclosure. System 150 includes control circuitry 160, gate driver 152, and switch 130. System 150, control circuitry 160, and gate driver 152 may be substantially the same as system 102, gate driver 152, and control circuitry 110 of FIG. 1A except for the differences described herein.

In the example shown, gate driver 152 may include parameter generation unit 112B. Parameter generation unit 112B may be substantially the same as parameter generation unit 112A of FIG. 1A, except that parameter generation unit 112B may include parameter generation logic implemented in circuitry integrated within gate driver 102 and configured to perform the operations of parameter generation unit 112A, e.g., to determine characteristics of switch 130 and to determine parameters 106 based on the switch characteristics.

Figure 2:
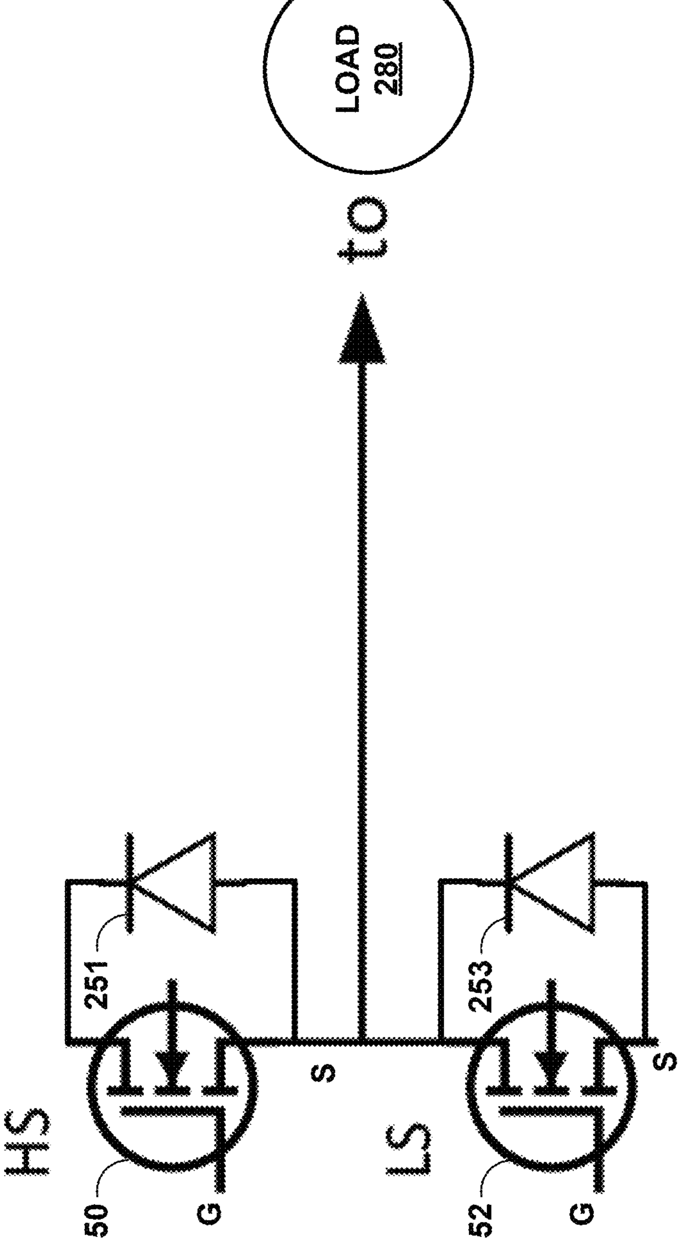
FIG. 2 is a conceptual diagram illustrating an example half-bridge switch controlled by a self-learning gate driver.

FIG. 2 is a conceptual diagram illustrating an example half-bridge switch 200 that may be controlled by a self-learning gate driver, in accordance with one or more techniques of this disclosure. Half-bridge switch 200 includes high side (HS) power switch 250, freewheeling diode 251, low side (LS) power switch 252, and freewheeling diode 253. HS power switch 250 and LS power switch 252 may be substantially similar to switch 130 described above. One or both of HS power switch 250 and LS power switch 252 may be driven by gate driver 102.

Figure 3:
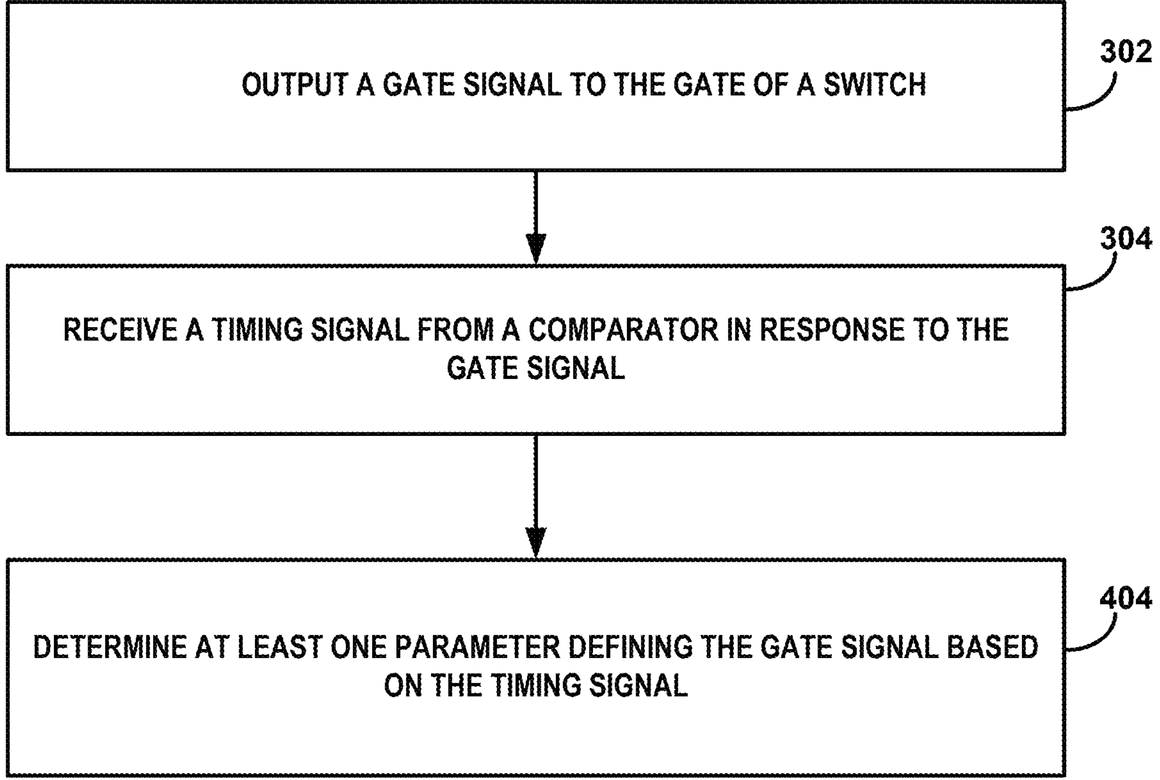
FIG. 3 is a flow diagram illustrating an example method of determining one or more sequencer parameters of a self-learning gate driver.

In a power inverter topology, each power switch has a parallel freewheeling diode. For example, HS power switch 250 comprises freewheeling diode 251 and LS power switch 252 comprises freewheeling diode 253. Freewheeling diode 251 can be either an intrinsic diode of HS power switch 250 or a separate diode. Similarly, freewheeling diode 253 can be either an intrinsic diode of LS power switch 252 or a separate diode. Freewheeling diode 251 can take over current if HS power switch 250 is switched off or if LS power switch 252 is switched off, depending on the direction of the current. FIG. 3 shows an inverter bridge leg including of a HS power switch 250 and a LS power switch 252, for example, as part of a B6 topology. For example, load 280 may be a 3-phase AC motor, and in a B6 topology, each phase of load 280 is connected to a half-bridge switch topology with a high-side switch (HS, connecting the phase node to the positive supply rail of $V_{DC}$) and a low-side switch (LS, connecting the phase node to the negative supply rail of $V_{DC}$). The B6 topology may represent a simple topology for AC drive operation. Other topologies, such as multi-level converters, can also be used with other loads and with the techniques described herein.

Generally, the conduction losses of a freewheeling diode (e.g., freewheeling diodes 251, 253) may be higher compared to conduction losses when conducting with a power switch (e.g., power switches 250, 252). As a consequence, the conduction losses can be reduced if the time interval where the freewheeling diode conducts the current are reduced, e.g., by activating the parallel power switch to commutate the current from the freewheeling diode to the power switch, e.g., for load 280 as a motor.

In an example of a positive phase current (e.g., current flow from half-bridge switch 250 to the load 280), a positive phase current flows from half-bridge switch 250 to the load 280 (which may be a motor). If power switches 250, 252 are switched off, the phase current continues flowing (due to the inductance of load 280, e.g., inductance of the windings of the motor) and establishes a current path through freewheeling diode 253 of power switch 252 (e.g., the low side power switch).

In general, it may be desirable to always include a dead-time between the deactivation of one switch and the activation of the other switch of a half-bridge to help to ensure break-before-make of the conduction phases of the power switches. The dead-time may allow for a transition from non-conducting to conducting (switch on) and vice-versa (switch off) and may strongly depend on the operating conditions of the switches and parasitic effects. In other words, an exact timing may not be predetermined and the switch-on transition may be faster than the switch-off transition. The dead-time (e.g., when both switches are controlled off) may be introduced, e.g., by a pulse width modulation (PWM) generator, to help to ensure correct commutation without short circuits. During dead-time, the phase currents may continue flowing, but may change from a conducting power switch to a freewheeling diode.

In the case of a conducting HS power switch 250 being switched off, a positive phase current commutates from HS power switch 250 to freewheeling diode 253 of LS power switch 252. As a consequence, the voltage of the phase node (connection point between HS power switch 250 and LS power switch 252) may change from $V_{DC}+$ (minus voltage drop over conducting HS power switch 250) to the voltage drop over freewheeling diode 253 of LS power switch 252. If the dead-time is much longer than the time needed for the current transition from HS power switch 250 to freewheeling diode 253 of low side power switch 252, both power switches 250, 252 may stay off and the freewheeling diode 253 influences the conduction losses.

In the opposite case, a positive phase current may pass through an active LS power switch 252. When LS power switch 252 is deactivated by the PWM, the current commutates from the LS power switch 252 to freewheeling diode 253 of the LS power switch 252. In this case, the voltage of the phase node may not change significantly. The duration of a current commutation from one active switch to the opposite freewheeling diode may be different due to the duration of the commutation from one active switch to the freewheeling diode of the same switch. A dead-time that is selected or possibly optimized for conduction loss reduction may also need to account for the different commutation scenarios.

In other words, an optimized dead-time for a commutation from HS power switch 250 to LS power switch 252 for a positive phase current may be different from the dead-time for the same commutation, but for a negative phase current. Furthermore, the dead-times for the commutation to LS power switch 252 and to HS power switch 250 may also be different for HS power switch 250 and LS power switch 252.

The phase current direction within a range of values during the PWM period may always the same (either always positive or always negative). In the area between the range of values, the phase current direction may change during a PWM period. It may be simpler to set an appropriate dead-time if the current direction is known. For example, for a phase current between the range of values, the dead-time for power switches 250, 252 may be set to a relatively high value (compared to an optimized value) in this area. The wording "relatively high" may depend on the type of power switches used and may be in a range of, for example, 100 nanoseconds (ns) to a few microseconds (μs). Even if the range of values is assumed to be a little bit bigger than absolutely needed (to deal with parasitic effects and unknown effects), the additional losses may not be very important because the value of the phase currents may still be smaller compared to current values outside of the range of values.

A desirable dead-time handling allows individual setting for HS power switch 250 and the LS power switch 252 depending on the value of the phase current. The dead-time between the PWM control signals is most commonly generated digitally in the PWM generator of the control device, e.g., gate driver 102. To avoid damage of the power conversion system in case of a program error or a local error in the control device, the gate driver unit 102 may support a minimum dead-time check. If the dead-time introduced by control circuitry 110 is smaller than a minimum dead-time defined in gate driver unit 102, gate driver unit 102 may use the minimum dead-time to protect the circuit. If the dead-time introduced by control circuitry 110 is longer than the minimum dead-time, the longer dead-time may be used. In order to provide protection against errors in the PWM generation in control circuitry 110 and to support dead-time optimization to reduce losses in power switches 250, 252, an adjustable minimum dead-time in gate driver unit 102 may be used.

Another aspect of an optimized commutation refers to the speed and the characteristics of the commutation itself. This may relate to the shape of the voltage and the current of a power switch (e.g., power switches 250, 252) during the transitions from on to off and vice versa. For example, a faster transition may allow for a shorter dead-time and reduced losses, but may lead to higher electro-magnetic interference (EMI) effects. EMI effects may be relevant for the design of all power conversion systems. Applying different shapes for the commutation from on to off, from off to on, for HS or for LS switches 250, 252 may reduce losses and improve EMI behavior depending on the areas above, between or below the range of values (dependent on phase current value). A dynamic change of parameters defining the commutation behavior of the power switches by gate driver 102 may be advantageous.

In examples in which load 280 comprises a 3-phase AC motor, gate driver 102 may include several voltage domains, due to the structure of the B6 bridge, because each switch of switches 250, 252 may use a control signal G with respect to a defined reference level, e.g., the source connection of the source S of each power switch. The example of FIG. 2 shows the symbols for MOSFET power switches. However, switches 250, 252 may comprise other types of power switches, such as, for example, IGBTs, SiC or GaN switches.

Each switch of switches 250, 252 may be controlled by an individual control signal G that is adapted to the desired voltage and/or current level by a gate driver, e.g., as part of gate driver 102. In some examples, such as for power MOSFETs, several independent (smaller) switch devices may be connected in parallel to increase the overall current capability of the parallel structure. In this disclosure, such a parallel connection may be considered as a single switch, e.g., as parallel switches forming one bigger switch.

In some examples, load 280 may be a three-phase AC drive motor in steady state operation, and three phase currents Iu, Iv, and Iw may be mainly sine-waves. The frequency of the phase currents may define a rotational speed of load 280 and the amplitude relates to the torque of load 280. Typical phase current frequencies are in the range between 0 and a few 100 Hz, depending on the construction of the motor (e.g. typical frequencies are below 2 kHz for traction inverters).

A relation of the amplitudes of the phase currents may change with the rotation of the rotor. For example, in a first segment of the rotation of the rotor, a first current Iu may deliver the current with the biggest positive value and the second phase current Iw shows the most negative phase current. The third phase current Iv may be somewhere between Iu and Iw. In another segment of the rotation of the rotor, the phase currents change values. For a certain while, each phase current is positive and bigger than a positive threshold or negative and lower than a negative threshold. The information whether a phase current is above the upper threshold, below the lower threshold or between both thresholds is related to each phase current (independent from the other phases). Because each phase current is normally handled by an independent inverter part (e.g., an inverter bridge leg, e.g. a half-bridge topology built with one HS and one LS switch), the information can also be considered independent for each independent inverter bridge leg.

In order to generate the "smooth" phase currents with reasonable losses in the switches 250, 252 may be operated in on/off mode, controlled by the PWM signals, e.g., generated by commutation circuitry (not shown). The duty cycle (e.g., a relation between on-time of a switch and PWM period) of each switch in relation to the other switches of switches 250, 252 defines the resulting phase current shape. The L/R time constant of the motor winding smoothens the effects of the on/off operation of switches 250, 252. The PWM frequency of switches 250, 252 may be much bigger than the frequency of the phase currents. Typical PWM frequency values may be in the range from 4 kHz to 30 kHz, depending on the switch and the maximum phase current amplitude. As such, a certain number of PWM periods (on/off cycles of a switch) in each of the segments of rotation of the rotor of load 280 occurs.

There are Mainly Two Types of Losses in a Switch:

(1) Conduction losses, due to the voltage drop over the switch in conducting mode and the current through the switch; and (2) Commutation losses, due to the switching activity (on/off=conducting/not conducting) of the switch, as controlled by the PWM signals.

The commutation losses may depend on the way how switches 250, 252 are driven by gate driver 102, e.g., the amount and profile of the gate current for each on/off and off/on transition of the switch.

Furthermore, the timing of the PWM signals between the two switches on the high-side and the low-side of the same motor phase may influence the commutation losses, e.g., dead-time. Both, the shape of the gate current as well as the dead time may be used to reduce the commutation losses. The amplitude of the phase currents may change with motor rotation. As such, the shape of the gate currents and the dead time may be dynamically adapted to the actual phase current value to reduce the commutation losses. Parameters 106 may include a set of commutation parameters that define a commutation speed and influence commutation losses, such as gate current value, gate current shape, gate voltage, and dead-time. To minimize the commutation losses, control circuitry 110 may adapt one or several of these parameters to the actual phase current of load 280. For a higher phase current value, a faster commutation may be beneficial regarding the losses. A faster commutation may lead to higher noise effects (EMI) that may be desirable to avoid. As such, half-bridge switch 200 may be configured for a compromise between commutation losses, which may be reduced using a faster commutation, and EMI behavior, which may be improved using a slower commutation.

In some examples, HS power switch 250 may be the active switch, and LS power switch 252 may be the passive switch, and in other examples, LS power switch 252 may be the active switch and HS power switch 250 may be the passive switch. In accordance with the techniques of the disclosure, parameter generation unit 112A (or parameter generation unit 112B or control circuitry 110) may be configured to determine switch characteristics of one or both of HS power switch 250 and LS power switch 252 based on a timing signal, e.g., from comparators 108, and may determine parameters 106 of one or both of HS power switch 250 and LS power switch 252 based on the switch characteristics. For example, control circuitry 110 may be configured to determine, based on the timing signal, the pre-charge time, the pre-discharge time, the switch-on slew rate, and the switch-off slew rate of one or both of HS power switch 250 and LS power switch 252, as either an active or passive switch. Control circuitry 110 may be configured to determine, based on the pre-discharge time and the switch-off slew rate, a dead time of one or both of HS power switch 250 and LS power switch 252, as either an active or passive switch.

In some examples, control circuitry 110 may be configured to change a load current connected to one or both of HS power switch 250 and LS power switch 252 and/or half-bridge switch 200, e.g., to determine one or more of parameters 106. For example, control circuitry 110 may be configured to control the current of load 108. Control circuitry 110 may be configured to increase a load current, e.g., of load 108, connected to one or both of HS power switch 250 and LS power switch 252 and/or half-bridge switch 200 to a predetermined maximum load current. Control circuitry 110 may be configured to then determine one or more parameters of parameters 106 that reduces an inductive current spike.

FIG. 3 is a flow diagram illustrating an example method of determining one or more sequencer parameters of a self-learning gate driver. Although the example method of FIG. 3 is described with respect to system 100 of FIG. 1A and half-bridge switch 200 of FIG. 2, the example technique of FIG. 3 may be performed using any device including a control circuitry, gate drivers, and switches, e.g., parameter generation unit 112B of FIG. 1B. FIG. 3 is described with reference to FIGS. 4-11.

Parameter generation unit 112A may cause gate driver 102 to output a gate signal to a gate of switch 130 (302). For example, parameter generation unit 112A may send a command via node 120 to gate driver 102 to drive switch 130 according to parameters 106. Gate driver 102 may use default parameter values, or the currently existing parameters values, for parameters 106, or parameter generation unit 112A may send parameter values to sequencer 104 for parameters 106 via node 120. Gate driver 102 may then output a gate signal defined by parameters 106 to the gate of switch 130.

Parameter generation unit 112A may receive a timing signal from comparators 108 (304). For example, gate driver 102 may include one or more comparators 108 configured to determine a timing signal based on a gate current and/or voltage or a source-drain current and/or voltage of switch 130 as compared to one or more threshold, or reference, voltages and/or or currents. The timing signal may be indicative of one or more characteristics of switch 130.

Parameter generation unit 112A may determine a characteristic of switch 130 based on the timing signal (306). For example, gate driver 102 may include one or more comparators 108 configured to determine a timing signal based on a gate current and/or voltage or a source-drain current and/or voltage of switch 130 as compared to one or more threshold, or reference, voltages and/or or currents. The timing signal may be indicative of one or more characteristics of switch 130.

Figure 4:
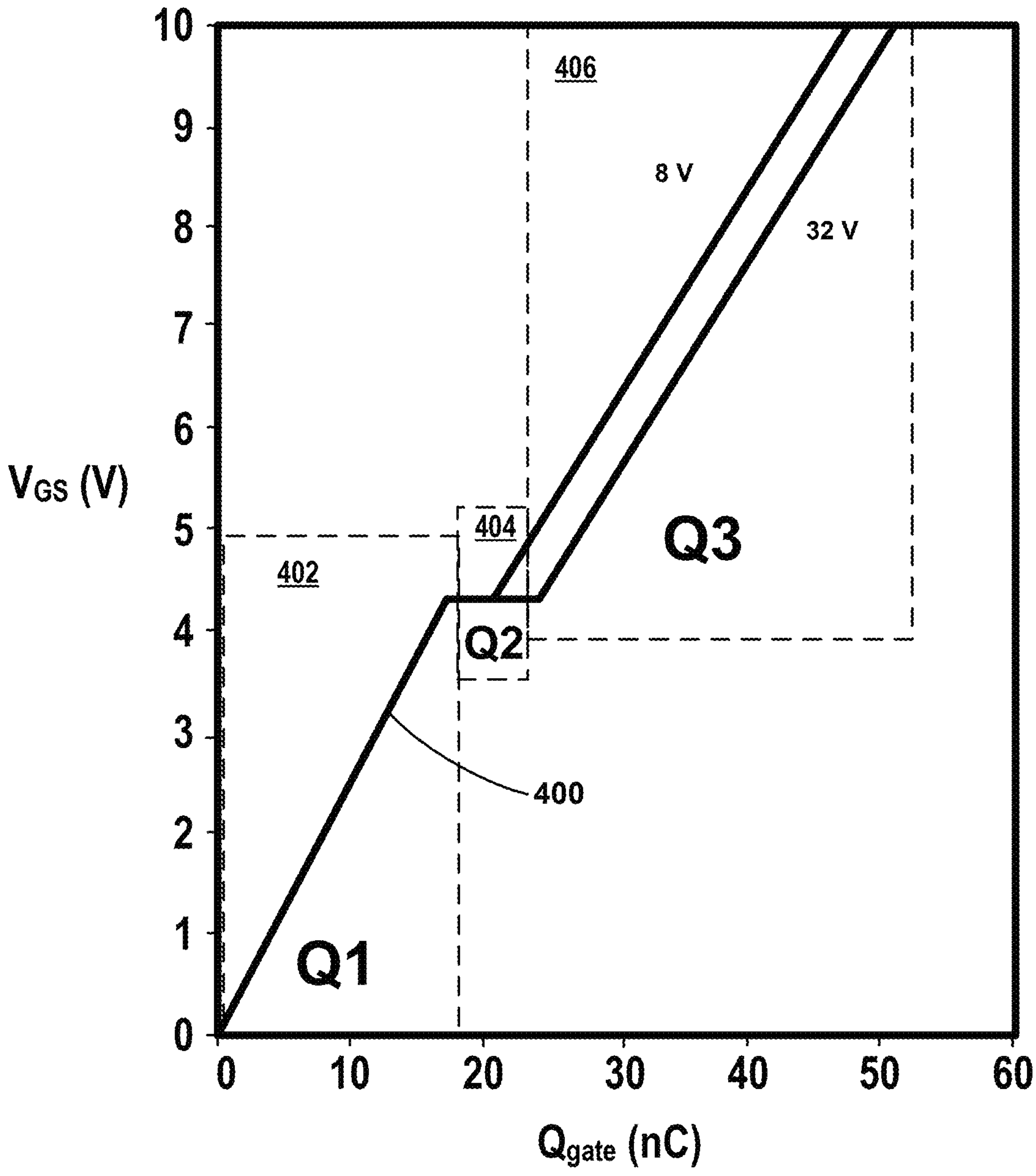
FIG. 4 is a plot of an example gate charge waveform of an example switch driven by a self-learning gate driver.

For example, parameter generation unit 112A may determine a pre-charge Q1, a Miller plateau charge Q2, and a charge Q3 of switch 130 based on one or more timing signals from comparators 108 in response to one or more gate signals applied to the gate of switch 130. FIG. 4 is a plot of an example gate charge waveform 400, e.g., of an example switch 130 driven by gate driver 102. Waveform 400 illustrates switch characteristics such as pre-charge Q1, a Miller plateau charge Q2, and a charge Q3. In the example shown, waveform 400 is a plot of the gate-source voltage of switch 130 as a function of the charge of the gate of switch 130. For example, gate driver 102 may drive the gate of switch 130 with a driving current and/or voltage, e.g., a gate signal. Charge of the gate (Qgate) increases as a function of time (e.g., the gate cannot fully charge instantly), and the actual gate voltage increases as a function of Qgate according to waveform 400. The pre-charge Q1 corresponds to the first portion 402 of waveform 400, the Miller plateau charge Q2 corresponds to the second portion 404 of waveform 400, and the charge Q3 corresponds to the third portion 406 of waveform 400.

Figure 5:
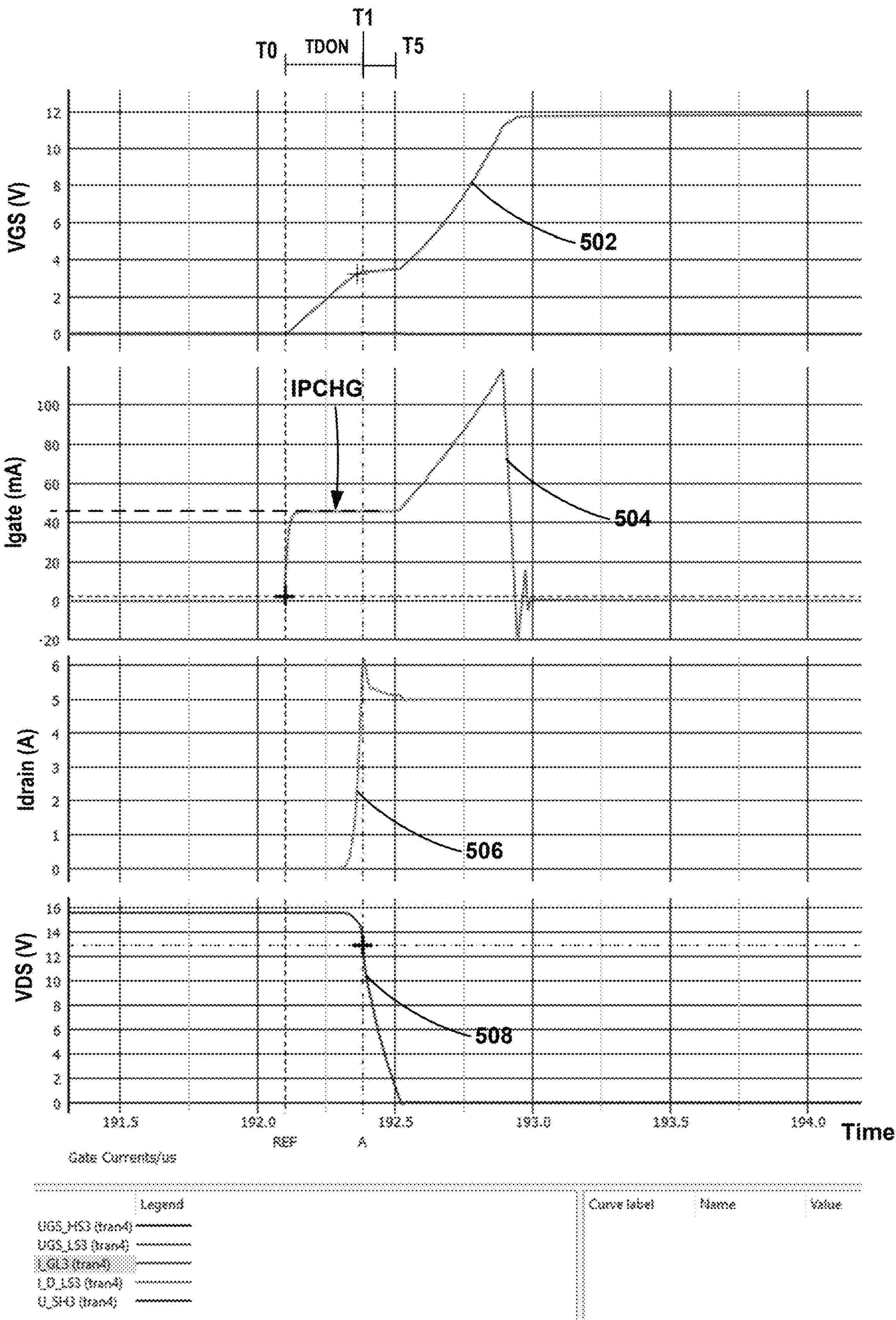
FIG. 5 illustrates plots of an example gate voltage, gate current, source-drain current, and source-drain voltage of an example switch driven by a self-learning gate driver, all plotted as function of time and showing determination of a pre-charge Q1 of the switch.

FIG. 5 illustrates plots 502-508 of a gate voltage (VGS), a gate current (Igate), a source-drain current (Idrain), and a source-drain voltage (VDS) of an example switch 130 driven by a self-learning gate driver 102, all plotted as function of time and showing determination of a pre-charge Q1 of the switch 130. In some examples, switch 130 may be an active MOSFET which performs the commutation of a half-bridge, e.g., half-bridge switch 200. Referring to FIG. 5, parameter generation unit 112A may cause gate driver 102 to output a gate signal Igate, illustrated as plot 504, comprising a known gate current IPCHG to the gate of switch 130 at time TO. In some examples, parameter generation unit 112A may cause gate driver 102 to output a gate current signal Igate comprising a plurality of gate currents, e.g., during pre-charge time TDON, Igate may include IPCHG, ICHG, and ICHGDV. The gate voltage of switch 130 increases until the Miller plateau at time T1, and a comparator of comparators 108 may output a timing signal indicative of pre-charge time TDON, e.g., including time T1, to parameter generation unit 112A. Parameter generation unit 112A may determine pre-charge time TDON based on time TO, the time at which IPCHG was output, and T1 from the timing signal. In some examples, TO may be from a comparator 108, e.g., a second comparator that outputs the time at which the gate current is received at the gate, e.g., based on an initial change in the gate voltage, rather than the time at which gate driver 102 outputs the gate signal, e.g., there may be a delay between outputting the gate signal and the time at which the gate signal is received at the gate, which may be indicated by an initial voltage change of the gate. At a time before T1, switch 130 starts to conduct and takes the load current, but the VDS of switch 130 may still be high. In some examples, the start of the drop, e.g., reduction, of VDS is indicative that a Miller plateau is reached.

In some examples, parameter generation unit 112A may determine the pre-charge Q1 of the gate of switch 130 based on the gate current IPCHG and the pre-charge time TDON (e.g., T1-T0). For example, Q1=IPCHG*TDON.

In some examples, parameter generation unit 112A may adjust, or tune, the gate current such that the pre-charge time TDON is within a target range, e.g., so as to get a measurement with improved accuracy and/or precision. The pre-charge Q1 may then be determined based on the measurement of TDON with the tuned gate current, or tuned gate signal current. For example, subsequent to determining TDON, gate driver 102 may drive switch 130 to a deactivated, or "OFF," state, and then parameter generation unit 112A may cause gate driver 102 to output a second, adjusted or tuned, gate signal, e.g., gate current IPCHG-2 (not shown) to the gate of switch 130 such that pre-charge time TDON is within a predetermined range of times. For example, IPCHG-2 may be greater than, or less than, the first IPCHG signal, in order to result in a second pre-charge time TDON-2 that is faster or slower than the first pre-charge time TDON and that is within the predetermined range of times. Comparators 108 may output the second timing signal indicative of the second pre-charge time TDON-2 to parameter generation unit 112A. Parameter generation unit 112A may determine the second pre-charge time TDON-2, and determine the pre-charge Q1 of the gate of switch 130 based on the second gate current IPCHG-2 and the second pre-charge time TDON-2, e.g., Q1=IPCHG-2*TDON-2, with a greater precision and/or accuracy by virtue of tuning IPCHG-2 such that TDON-2 is within the predetermined range of times for which timing measurements, e.g., one or both of T0, T1, are more precise and/or accurate.

Figure 6:
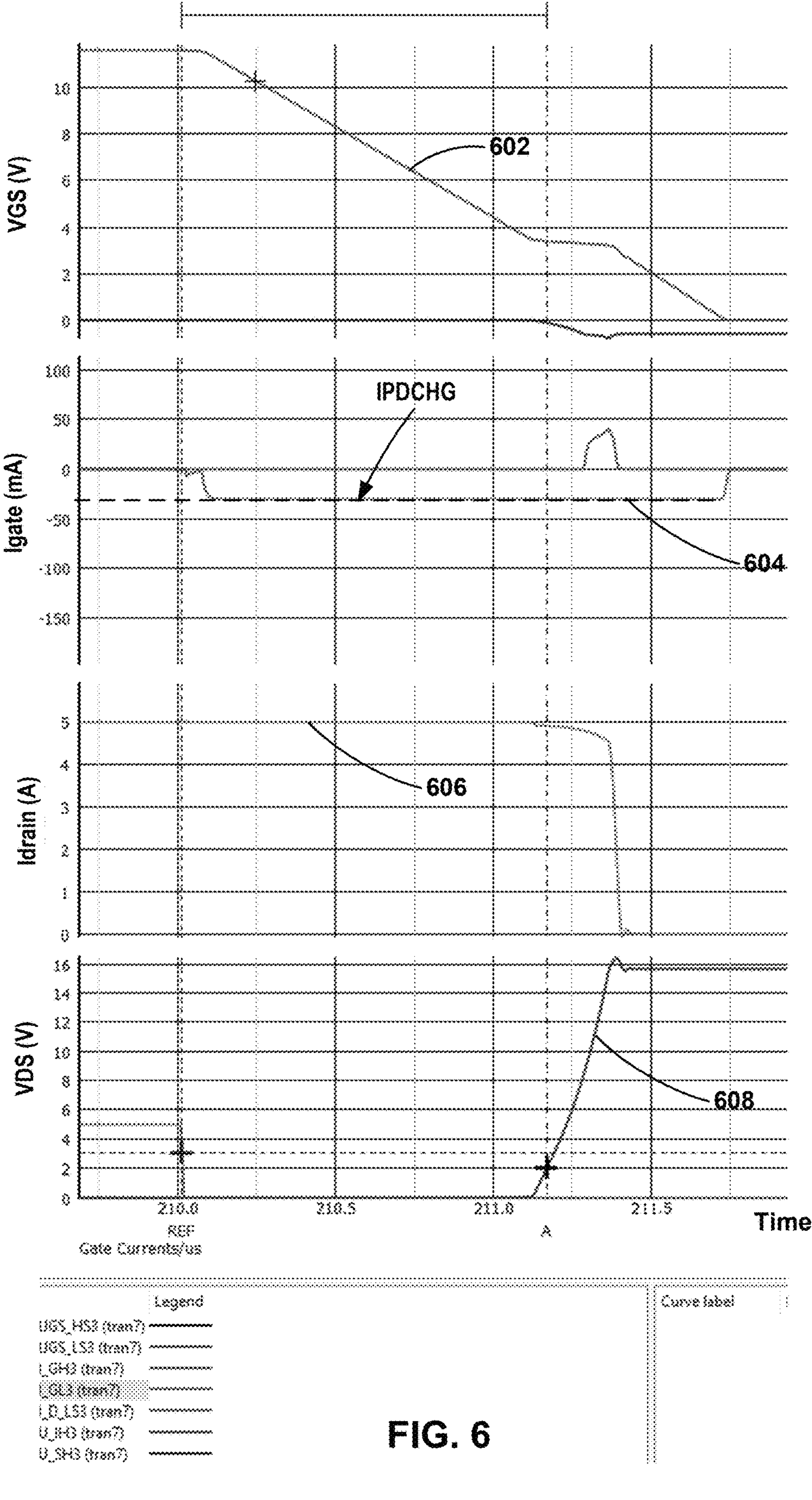
FIG. 6 is a plot of an example gate voltage, gate current, source-drain current, and source-drain voltage as function of time for determining a charge Q3 of a switch.

FIG. 6 illustrates plots 602-608 of a gate voltage (VGS), a gate current (Igate), a source-drain current (Idrain), and a source-drain voltage (VDS) of an example switch 130 driven by a self-learning gate driver 102, all plotted as function of time and showing determination of a charge Q3 of the switch 130. Parameter generation unit 112A may cause gate driver 102 to output a gate signal Igate, illustrated as plot 604, comprising a known gate current IPDCHG (e.g., a pre-discharge current) to the gate of switch 130 at time T2. In the example shown, before time T2, switch 130 is in the activated state, or in the "ON" state allowing a load current to flow. In the example shown, IPDCHG is a negative current. In some examples, parameter generation unit 112A may cause gate driver 102 to output a gate current signal Igate comprising a plurality of gate currents, e.g., during pre-discharge time TDOFF, Igate may include IPDCHG, IDCHG, and IDCHGDV.

In the example shown, the gate voltage of switch 130 decreases until the Miller plateau at time T3, and a comparator of comparators 108 may output a timing signal indicative of pre-discharge time TDOFF, e.g., including time T3, to parameter generation unit 112A. Parameter generation unit 112A may determine pre-discharge time TDOFF based on time T2, the time at which IPDCHG was output, and T3 from the timing signal. In some examples, T2 may be from a comparator 108, e.g., a second comparator that outputs the time at which the gate current is received at the gate, e.g., based on an initial change in the gate voltage, rather than the time at which gate driver 102 outputs the gate signal, e.g., there may be a delay between outputting the gate signal and the time at which the gate signal is received at the gate, which may be indicated by an initial voltage change of the gate. At a time before T3, switch 130 is beginning to switch to the deactivated state, or "OFF," such that the source-drain current 506 is just beginning to be reduced towards zero, and the source-drain voltage is beginning to increase.

In some examples, parameter generation unit 112A may determine the charge Q3 of the gate of switch 130 based on the gate current IPDCHG and the pre-discharge time TDOFF (e.g., T3-T2). For example, Q3=IPDCHG*TDOFF.

In some examples, parameter generation unit 112A may adjust, or tune, the gate current such that the pre-discharge time is within a target range, e.g., so as to get a measurement with improved accuracy and/or precision. The pre-discharge Q3 may then be determined based on the measurement of TDOFF with the tuned gate current, or tuned gate signal current. For example, subsequent to determining TDOFF, gate driver 102 may drive switch 130 to an activated, or "ON," state, and then parameter generation unit 112A may cause gate driver 102 to output a second, adjusted or tuned, gate signal, e.g., gate current IPDCHG-2 (not shown) to the gate of switch 130 such that pre-discharge time TDOFF is within a predetermined range of times. For example, IPDCHG-2 may be greater than, or less than, the first IPDCHG signal, in order to result in a second pre-discharge time TDOFF-2 that is faster or slower than the first pre-discharge time TDOFF and that is within the predetermined range of times. Comparators 108 may output the second timing signal indicative of the second pre-discharge time TDOFF-2 to parameter generation unit 112A. Parameter generation unit 112A may determine the second pre-discharge time TDOFF-2, and determine the charge Q3 of the gate of switch 130 based on the second gate current IPDCHG-2 and the second pre-discharge time TDOFF-2, e.g., Q3=IPDCHG-2*TDOFF-2, with a greater precision and/or accuracy by virtue of tuning IPDCHG-2 such that TDOFF-2 is within the predetermined range of times for which timing measurements, e.g., one or both of T2, T3, are more precise and/or accurate.

Figure 7:
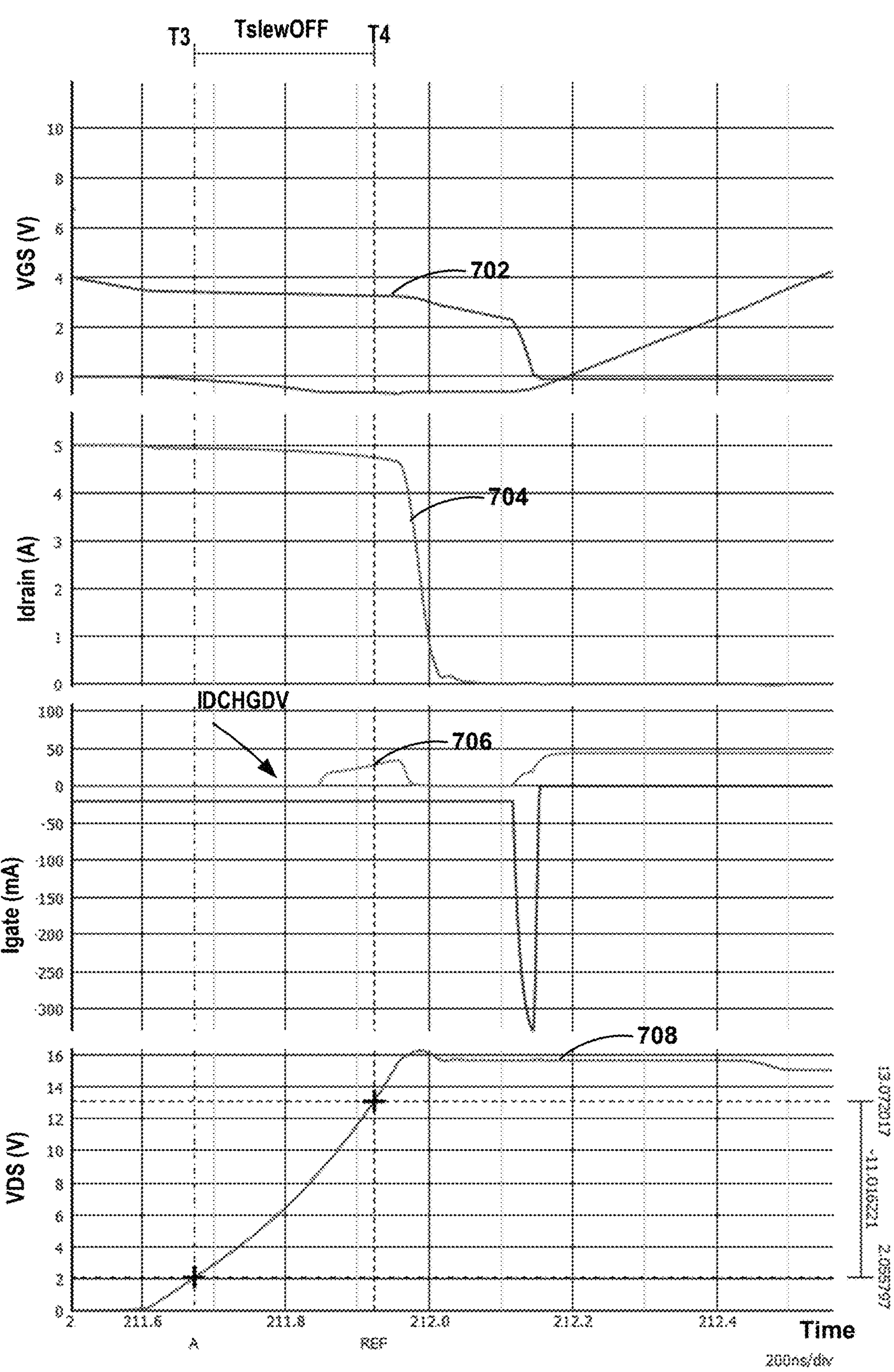
FIG. 7 is a plot of an example gate voltage, source-drain current, gate current, and source-drain voltage as function of time for determining a Miller plateau charge Q2 of a switch.

FIG. 7 illustrates plots 702-708 of a gate voltage (VGS), a source-drain current (Idrain), a gate current (Igate), and a source-drain voltage (VDS) of an example switch 130 driven by a self-learning gate driver 102, all plotted as function of time and showing determination of a Miller plateau charge Q2 of the switch 130. Parameter generation unit 112A may cause gate driver 102 to output a gate signal comprising a known gate current IDCHGDV (e.g., a discharge current for the dv/dt phase) to the gate of switch 130 that is in the activated, or "ON" state allowing a load current to flow, as described above. In the example shown, IDCHGDV is a zero current. The gate voltage of switch 130 decreases until the Miller plateau at time T3, remains substantially constant for the duration of the Miller plateau until time T4, which may be the switch-off slew rate TslewOFF, and comparators 108 may output a timing signal indicative of the switch-off slew rate, e.g., including times T3 and T4, to parameter generation unit 112A. At a time before T4, switch 130 is switching to the deactivated state, or "OFF," such that the source-drain current 506 is reducing towards zero, and the source-drain voltage is almost increased to its maximum value in the OFF state.

In some examples, parameter generation unit 112A may determine the Miller plateau charge Q2 of the gate of switch 130 based on the gate current IDCHGDV and the switch-off slew rate. For example, Q2=IDCHGDV*TslewOFF.

In some examples, parameter generation unit 112A may run tests to verify the pre-charge time, the pre-discharge time, the pre-charge Q1, the Miller plateau charge Q2, the charge Q3, the switch-off slew rate, and/or to determine the switch-on slew rate (which may be substantially similar to as described above at FIG. 7 with the switch-off slew rate, but uses a timing signal including T1 and T5 in FIG. 5 when activating switch 130, e.g., the switch-on slew rate=T5-T1). In some examples, parameter generation unit 112A may cause sequencer 106 to change parameters 108 based on the verification tests, e.g., to correct pre-charge currents, pre-discharge currents to avoid too strong of a pre-charge or pre-discharge.

Figure 8:
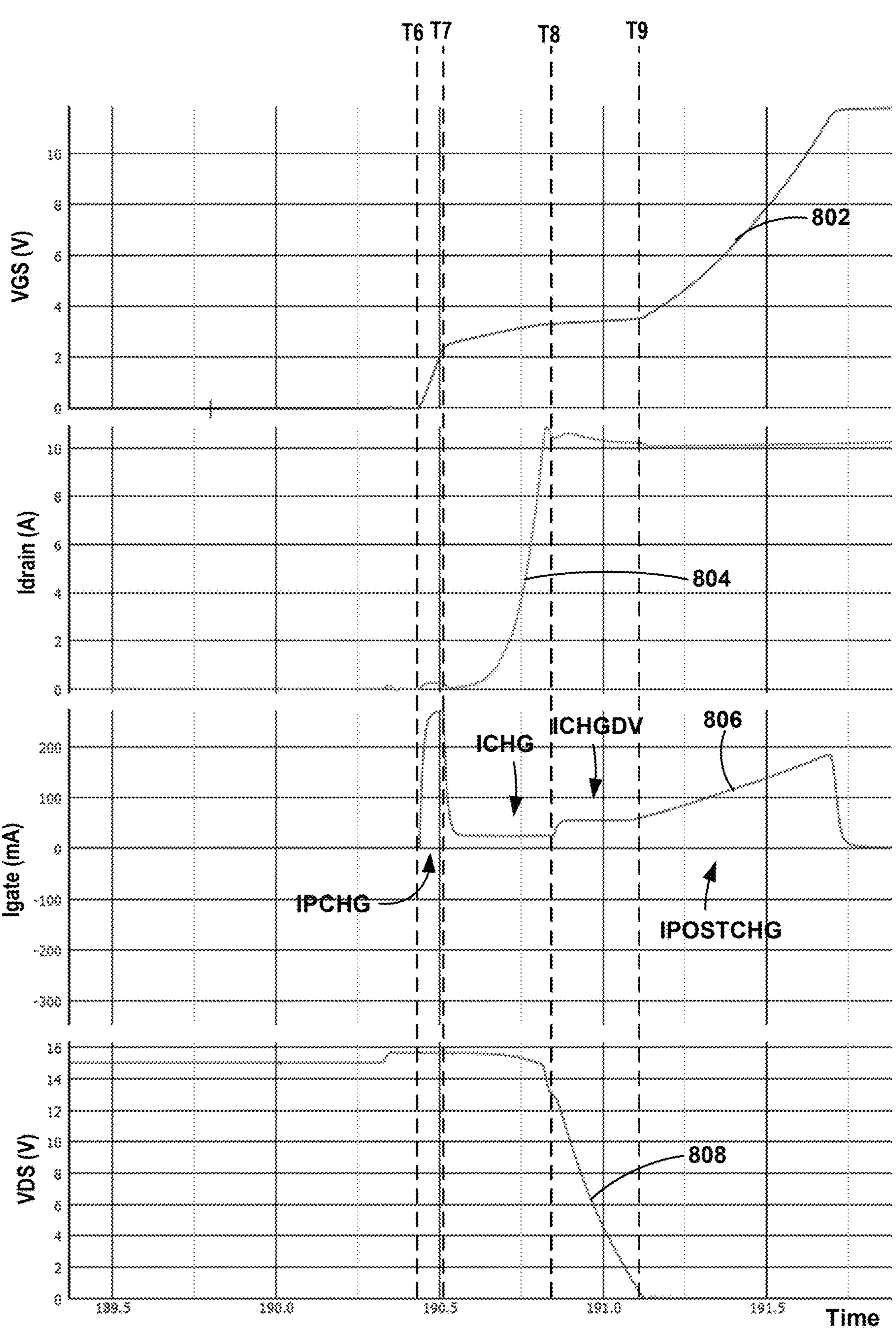
FIG. 8 is a plot of an example gate voltage, source-drain current, gate current, and source-drain voltage (VDS) of an example switch driven by a self-learning gate driver, all plotted as function of time and showing verification of timings of the switch.

FIG. 8 illustrates plots 802-808 of a gate voltage (VGS), a source-drain current (Idrain), a gate current (Igate), and a source-drain voltage (VDS) of an example switch 130 driven by a self-learning gate driver 102, all plotted as function of time and showing verification of timings of the switch 130. In the example shown, parameter generation unit 112A may cause gate driver 102 to output a gate signal 806. Between a first time T6 and a second time T7, switch 130 may be in a pre-charge phase where the gate current is IPCHG for the pre-charge time TPCHG, e.g., TPCHG=T7-T6. Between second time T7 and a third time T8, switch 130 may be in a charge phase, or a dI/dt phase, where the gate current is ICHG a time T8-T7. Between third time T8 and a fourth time T9, switch 130 may be in a Miller-charge phase, or a dV/dt phase, where the gate current is ICHGDV for a time T9-T8. After time T9, switch 130 may be in a post-charge phase where the gate current is IPOSTCHG while the switch is in the ON state. In some examples, there may be a relatively short settling time (substantially less than the time of the phase) between phases, e.g., just after times T7-T9.

In the example shown, parameters 106 may include a pre-charge time TPCHG that ends, or stops, before the Miller plateau starts so as to not overlap with the dI/dt (charge) phase. After the pre-charge phase, e.g., after T7, circuitry 110 may cause gate driver 102 to output a gate signal 806 at the dI/dt phase to a first corresponding low gate current to switch softly dI/dt. When the Miller plateau starts, e.g., at T8, parameter generation unit 112A may cause gate driver 102 to output a gate signal 806 to a second corresponding low gate current to control the dV/dt phase separately. After the Miller plateau, e.g., after T9, parameter generation unit 112A may cause gate driver 102 to output a gate signal 806 with a post-charge current IPOSTCHG that may be increased, e.g., because the electromagnetic compatibility (EMC) critical phases, e.g., the dI/dt, and dV/dt phases, are over (e.g., completed). For example, parameter generation unit 112A may cause gate driver 102 to output a gate signal 806 that switches fast with a high gate current for non-critical EMC phases and that switches slow for critical EMC phases. In some examples, parameter generation unit 112A may cause gate driver 102 to output gate signal 806 to control the dI/dt and dV/dt phases separately to reduce spikes caused by stray inductivities.

In some examples, parameter generation unit 112A may determine a dead time of switch 130, and/or a dead time of an active switch and a dead time of a passive switch, e.g., dead times of each of switches 250, 252 of half-bridge switch 200. Parameter generation unit 112A may determine dead time of a switch 130, 250, and/or 252 based on the pre-discharge time TPDCHG and the switch-off slew rate.

In some examples, parameter generation unit 112A may cause gate driver 102 change a load current connected to switch 130 or one or both of HS power switch 250 and LS power switch 252 and/or half-bridge switch 200, e.g., to determine one or more of parameters 106. For example, parameter generation unit 112A may cause gate driver 102 to control the current of load 108. Parameter generation unit 112A may cause gate driver 102 to increase a load current, e.g., of load 108 connected to switch 130 or load 280 connected to one or both of HS power switch 250 and LS power switch 252 and/or half-bridge switch 200, to a predetermined maximum load current. Parameter generation unit 112A may be configured to then determine one or more parameters of parameters 106 that reduces an inductive current spike.

The techniques described in this disclosure may be implemented, at least in part, in hardware, software, firmware or any combination thereof. For example, various aspects of the described techniques may be implemented within one or more processors or processing circuitry, including one or more micro-controllers (e.g., micro-controllers 102, 502, and/or 602), microprocessors, digital signal processors (DSPs), application specific integrated circuits (ASICs), field programmable gate arrays (FPGAs), or any other equivalent integrated or discrete logic circuitry, as well as any combinations of such components. The term “processor” or “processing circuitry” may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various operations and functions described in this disclosure. In addition, any of the described units, circuits or components may be implemented together or separately as discrete but interoperable logic devices. Depiction of different features as circuits or units is intended to highlight different functional aspects and does not necessarily imply that such circuits or units must be realized by separate hardware or software components. Rather, functionality associated with one or more circuits or units may be performed by separate hardware or software components or integrated within common or separate hardware or software components.

The techniques described in this disclosure may also be embodied or encoded in a computer-readable medium, such as a computer-readable storage medium, containing instructions that may be described as non-transitory media. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

Various aspects of the techniques may enable the following examples.

Example 1: A gate driver circuit including: a sequencer comprising a plurality of parameters defining a gate signal, wherein the gate driver circuit is configured to output the gate signal to a gate of a switch; and a comparator configured to output a timing signal to a parameter generation unit, wherein the timing signal is based on a response of the switch receiving the gate signal from the gate driver circuit, wherein the timing signal is indicative of a characteristic of the switch, wherein the parameter generation unit is configured to determine a parameter of the plurality of parameters based on the characteristic of the switch, and wherein the gate driver circuit is configured to receive input from the parameter generation unit and store the input in the sequencer, wherein the input defines the parameter of the plurality of parameters determined by the parameter generation unit.

Example 2: The gate driver circuit of example 1, wherein the at least one parameter comprises at least one of the gate signal current, a pre-charge time, a pre-charge current, a pre-discharge time, or a pre-discharge current.

Example 3: The gate driver circuit of example 1 or example 2, wherein the at least one characteristic of the switch comprises at least one of a pre-charge Q1, a Miller plateau charge Q2, a charge Q3, a switch-on slew rate, or a switch-off slew rate.

Example 4: The gate driver circuit of example 3, wherein the first switch is an active switch connected to a load, wherein at least one of the pre-charge time, the pre-discharge time, the switch-on slew rate, or the switch-off slew rate is indicative of a current setting for a passive switch connected to the load.

Example 5: The gate driver circuit of example 3 or example 4, wherein the pre-discharge time and the switch-off slew rate are indicative of a first dead time of the active switch and a second dead time of the passive switch.

Example 6: The gate driver circuit of any one of examples 1 through 5, wherein the parameter generation unit comprises a processor.

Example 7: The gate driver circuit of any one of examples 1 through 6, wherein the parameter generation unit comprises a parameter generation logic implemented in circuitry within the gate driver circuit.

Example 8: A system including: a gate driver configured to output a gate signal to a gate of a switch; a sequencer comprising a plurality of parameters defining the gate signal; and a parameter generation unit, configured to determine a parameter of the plurality of parameters and to cause the gate driver to output the gate signal to the switch according to the at least one parameter.

Example 9: The system of example 8, wherein the parameter generation unit is further configured to determine the parameter based on at least one characteristic of the switch.

Example 10: The system of example 9, wherein the at least one characteristic comprises at least one of a pre-charge Q1, a Miller plateau charge Q2, a charge Q3, a switch-on slew rate, or a switch-off slew rate.

Example 11: The system of example 9 or example 10, wherein the parameter comprises at least one of the gate signal current, a pre-charge time, a pre-charge current, a pre-discharge time, or a pre-discharge current.

Example 12: The system of any one of examples 9 through 11, wherein the gate driver comprises a first comparator and a second comparator, wherein the parameter generation unit is further configured to: receive, from first the first comparator and the second comparator, a timing signal; and determine, based on the timing signal, at least one of the pre-charge time, the pre-discharge time, the switch-on slew rate, or the switch-off slew rate.

Example 13: The system of example 12, wherein the parameter generation unit is further configured to determine, based on the pre-discharge time and the switch-off slew rate, a dead time of the switch.

Example 14: The system of any one of examples 9 through 13, wherein the parameter is a first parameter, wherein the parameter generation unit is further configured to: cause the gate driver to increase a load current connected to the switch to a predetermined maximum load current; and determine a second parameter of the plurality of parameters that reduces an inductive current spike.

Example 15: The system of any one of examples 8 through 14, wherein the parameter generation unit comprises a processor.

Example 16: The system of any one of examples 8 through 14, wherein the parameter generation unit comprises a parameter generation logic implemented in circuitry within the gate driver.

Example 17: A method including: causing, by a parameter generation unit, a gate driver to output a gate signal to a gate of a switch, wherein the gate driver includes a sequencer comprising a plurality of parameters defining the gate signal; receiving, in response to the gate signal and by the parameter generation unit from a comparator of the gate driver, a timing signal; determining, by the parameter generation unit, a characteristic of the switch based on the timing signal.

Example 18: The method of example 17, wherein the timing signal is indicative of a first pre-charge time, where in the gate signal is a first gate signal, wherein the timing signal is a first timing signal, the method further includes determining, by the parameter generation unit and based on the first pre-charge time, a second gate signal comprising a pre-charge current level such that the pre-charge time is within a predetermined range of times; causing, by the parameter generation unit, the gate driver to output the second gate signal to the gate of the switch; receiving, by the parameter generation unit and from the comparator of the gate driver, a second timing signal indicative of a second pre-charge time within the predetermined range of time; and determining, by the parameter generation unit and based on the pre-charge current level and the second pre-charge time, a pre-charge Q1 of the gate of the switch.

Example 19: The method of example 18, wherein the first timing signal is indicative of a first pre-discharge time, the method further includes determining, by the parameter generation unit and based on the first pre-discharge time, a third gate signal comprising a discharge current level such that the pre-discharge time is within the predetermined range of times; causing, by the parameter generation unit, the gate driver to output the third gate signal to the gate of the switch; receiving, by the parameter generation unit and from the comparator of the gate driver, a third timing signal indicative of a second pre-discharge time within the predetermined range of time; and determining, by the parameter generation unit and based on the discharge current level and the second pre-discharge time, a charge Q3 of the gate of the switch.

Example 20: The method of example 19, wherein the timing signal is indicative of a switch-off slew rate, the method further includes determining, by the parameter generation unit and based on a discharge current level of the first gate signal and the switch-off slew rate, a Miller plateau charge Q2 of the gate of the switch.

Example 21: The method of example 20, wherein the at least one parameter is determined based on the pre-charge Q1, the Miller plateau charge Q2, the charge Q3, the switch-on slew rate, and the switch-off slew rate.

Example 22: The method of any of example 20 or example 21, further includes causing, by the parameter generation unit, the gate driver to increase a load current connected to the switch to a predetermined maximum load current; and determining, by the parameter generation unit, at least one parameter of the plurality of parameters that reduces an inductive current spike.

Example 23: The method of any of examples 20 through 22, further comprising determining, based on the second pre-discharge time and the switch-off slew rate, a dead time of the switch.

Example 24: The method of any of examples 17 through 23, wherein the switch is an active switch, the method further comprising determining, by the parameter generation unit and based on at least one of the pre-charge time, the pre-discharge time, the switch-on slew rate, or the switch-off slew rate, a current setting for the passive switch.

Example 25: The system of any one of examples 17 through 24, wherein the parameter generation unit comprises a processor.

Example 26: The system of any one of examples 17 through 24, wherein the parameter generation unit comprises a parameter generation logic implemented in circuitry within the gate driver.

Various examples of the disclosure have been described. These and other examples are within the scope of the following claims.

What is claimed is:

1. A gate driver circuit configured to perform a self-learning process associated with a switch that is connected to the gate driver circuit, the gate driver circuit comprising:

a sequencer comprising a plurality of parameters defining a gate signal, wherein the gate driver circuit is configured to output the gate signal to a gate of the switch; and a comparator configured to output a timing signal to a parameter generation unit, wherein the timing signal is based on a response of the switch receiving the gate signal from the gate driver circuit, wherein the timing signal is indicative of characteristics of the switch, wherein the parameter generation unit is configured to determine values for at least some of the plurality of parameters based on the characteristic of the switch, wherein the plurality of parameters include a pre-charge value Q1, and wherein to determine the values, the parameter generation unit is configured to determine the pre-charge value Q1 based on a calculation:

$$Q1=IPCHG*TDON,$$

wherein IPCHG is a pre-charge gate current, and TDON is a pre-charge time, and wherein the gate driver circuit is configured to receive input from the parameter generation unit and store the input in the sequencer, wherein the input defines the at least some of plurality of parameters determined by the parameter generation unit.

2. The gate driver circuit of claim 1, wherein the plurality of parameters include a Miller plateau charge value Q2, and wherein to determine the values, the parameter generation unit is configured to determine the Miller plateau charge value Q2 based on a calculation:

$$Q2=IDCHGDV*TslewOFF,$$

wherein IDCHGDV is a Miller plateau gate current, and TslewOFF is a switch-off slew rate.

3. The gate driver circuit of claim 2, wherein the plurality of parameters include a charge value Q3 corresponding to a point in time after the Miller Plateau, and wherein to determine the values, the parameter generation unit is configured to determine the charge value Q3 based on a calculation:

$$Q3=IPDCHG*TDOFF,$$

wherein IPDCHG is a gate current after the Miller plateau and TDOFF is a pre-discharge time.

4. The gate driver circuit of claim 3, wherein the switch is an active switch connected to a load, wherein at least one of the characteristics of the switch is indicative of a current setting for a passive switch connected to the load.

5. The gate driver circuit of claim 4, wherein the pre-discharge time and the switch-off slew rate are indicative of a first dead time of the active switch and a second dead time of the passive switch.

6. The gate driver circuit of claim 1, wherein the parameter generation unit comprises a processor.

7. The gate driver circuit of claim 1, wherein the parameter generation unit comprises a parameter generation logic implemented in circuitry within the gate driver circuit.

8. A system configured to perform a self-learning process associated with a switch, the system comprising:

a gate driver configured to output a gate signal to a gate of the switch;

a sequencer comprising a plurality of parameters defining the gate signal; and a parameter generation unit configured to determine values for at least some of the plurality of parameters based on characteristic of the switch and to cause the gate driver to output the gate signal to the switch according to the at least some of values of the plurality of parameters, wherein the plurality of parameters include a pre-charge value Q1, and wherein to determine the values, the parameter generation unit is configured to determine the pre-charge value Q1 based on a calculation:

$$Q1=IPCHG*TDON,$$

wherein IPCHG is a pre-charge gate current, and TDON is a pre-charge time.

9. The system of claim 8, wherein the plurality of parameters include a Miller plateau charge value Q2, and wherein to determine the values, the parameter generation unit is configured to determine the Miller plateau charge value Q2 based on a calculation:

$$Q2=IDCHGDV*TslewOFF,$$

wherein IDCHGDV is a Miller plateau gate current, and TslewOFF is a switch-off slew rate.

10. The system of claim 9, wherein the plurality of parameters include a charge value Q3 corresponding to a point in time after the Miller Plateau, and wherein to determine the values, the parameter generation unit is configured to determine the charge value Q3 based on a calculation:

$$Q3=IPDCHG*TDOFF,$$

wherein IPDCHG is a gate current after the Miller plateau and TDOFF is a pre-discharge time.

11. The system of claim 10, wherein the gate driver comprises a first comparator and a second comparator, wherein the parameter generation unit is further configured to:

receive, from first the first comparator and the second comparator, a timing signal; and determine, based on the timing signal, at least one of the pre-charge time, the pre-discharge time, a switch-on slew rate, or the switch-off slew rate.

12. The system of claim 10, wherein the parameter generation unit is further configured to determine, based on the pre-discharge time and the switch-off slew rate, a dead time of the switch.

13. The system of claim 8, wherein the parameter generation unit is further configured to:

cause the gate driver to increase a load current connected to the switch to a predetermined maximum load current; and determine one of the plurality of parameters that reduces an inductive current spike.

14. A method of performing a self-learning process associated with a switch, the method comprising:

causing, by a parameter generation unit, a gate driver to output a gate signal to a gate of the switch, wherein the gate driver includes a sequencer comprising a plurality of parameters defining the gate signal;

receiving, in response to the gate signal and by the parameter generation unit from a comparator of the gate driver, one or more timing signals;

determining, by the parameter generation unit, at least some values indicative of characteristics of the switch based on the one or more timing signals, wherein the plurality of parameters include a pre-charge value Q1, and wherein determining the at least some values includes determining the pre-charge value Q1 based on a calculation:

$$Q1=IPCHG*TDON,$$

wherein IPCHG is a pre-charge gate current, and TDON is a pre-charge time.

15. The method of claim 14, wherein the gate signal is a first gate signal and the pre-charge time is a first pre-charge time, the method further comprising:

determining, by the parameter generation unit and based on the first pre-charge time, a second gate signal comprising a pre-charge current level such that a second pre-charge time is within a predetermined range of times;

causing, by the parameter generation unit, the gate driver to output the second gate signal to the gate of the switch;

receiving, by the parameter generation unit and from the comparator of the gate driver, a second timing signal indicative of a second pre-charge time within the predetermined range of time; and determining, by the parameter generation unit and based on the pre-charge current level and the second pre-charge time, a second pre-charge value of the gate of the switch.

16. The method of claim 15, wherein a first timing signal is indicative of a first pre-discharge time, the method further comprising:

determining, by the parameter generation unit and based on the first pre-discharge time, a third gate signal comprising a discharge current level such that the pre-discharge time is within the predetermined range of times;

causing, by the parameter generation unit, the gate driver to output the third gate signal to the gate of the switch;

receiving, by the parameter generation unit and from the comparator of the gate driver, a third timing signal indicative of a second pre-discharge time within the predetermined range of time; and determining, by the parameter generation unit and based on the discharge current level and the second pre-discharge time, a charge value Q3 corresponding to a point in time after a Miller Plateau of the gate of the switch.

17. The method of claim 16, wherein the timing signal is indicative of a switch-off slew rate, the method further comprising:

determining, by the parameter generation unit and based on a discharge current level of the first gate signal and the switch-off slew rate, a Miller plateau charge value Q2 of the gate of the switch.

18. The method of claim 17, wherein at least some of the parameters are determined based on the pre-charge value Q1, the Miller plateau charge value Q2, the charge value Q3 corresponding to a point in time after the Miller Plateau, a switch-on slew rate, and the switch-off slew rate.

19. The method of claim 17, further comprising:

causing, by the parameter generation unit, the gate driver to increase a load current connected to the switch to a predetermined maximum load current; and determining, by the parameter generation unit, at least one parameter of the plurality of parameters that reduces an inductive current spike.

20. The method of claim 17, further comprising determining, based on the second pre-discharge time and the switch-off slew rate, a dead time of the switch.

21. The method of claim 14, wherein the switch is an active switch, the method further comprising determining, by the parameter generation unit and based on at least one of the pre-charge time, a pre-discharge time, a switch-on slew rate of the active switch, or a switch-off slew rate of the active switch, a current setting for a passive switch.

22. A gate driver circuit configured to:

output gate signals to a gate of a power switch;

store values in a sequencer that define parameters of the gate signal;

determine a pre-charge value Q1 of the power switch based on a calculation:

$$Q1=IPCHG*TDON,$$

wherein IPCHG is a pre-charge gate current, and TDON is a pre-charge time determined by a comparator circuit; and change values in the sequencer based on the calculation.

23. The gate driver circuit of claim 22, wherein the calculation is a first calculation and the gate driver is further configured to:

determine a Miller plateau charge value Q2 of the power switch based on a second calculation:

$$Q2=IDCHGDV*TslewOFF,$$

wherein IDCHGDV is a Miller plateau gate current, and TslewOFF is a switch-off slew rate; and change the values in the sequencer based on the first calculation and the second calculation.

24. The gate driver circuit of claim 23 the gate driver is further configured to:

determine a charge value Q3 of the power switch corresponding to a point in time after the Miller Plateau based on a third calculation:

$$Q3=IPDCHG*TDOFF,$$

wherein IPDCHG is a gate current after the Miller plateau and TDOFF is a pre-discharge time.

* * * * *